United States Patent [19]

Tada et al.

[11] Patent Number: 4,944,834
[45] Date of Patent: Jul. 31, 1990

[54] PROCESS OF PULLING A CRYSTAL

[75] Inventors: Kohji Tada; Toshihiro Kotani, both of Osaka, Japan

[73] Assignee: Sumitomo Electric Industries, Ltd., Osaka, Japan

[21] Appl. No.: 218,457

[22] Filed: Jul. 7, 1988

Related U.S. Application Data

[63] Continuation of Ser. No. 900,008, Aug. 20, 1986, abandoned.

[30] Foreign Application Priority Data

Sep. 11, 1985 [JP] Japan ................................. 60-199377

[51] Int. Cl.$^5$ ............................................. C30B 15/24
[52] U.S. Cl. ............................... 156/620.5; 156/620.4; 156/620.3; 156/602.2; 156/614.1; 156/617.1
[58] Field of Search .................. 156/601, 617.1, 618.1, 156/619.1, 620.1, 620.2, 620.3, 620.4, 620.5; 422/249, 246; 373/156, 163; 432/254.1, 262

[56] References Cited

U.S. PATENT DOCUMENTS

| | | | |
|---|---|---|---|
| 2,876,147 | 3/1959 | Kniepkamp et al. | 422/249 |
| 3,002,824 | 10/1961 | Francois | 156/DIG. 83 |
| 4,167,554 | 9/1979 | Fisher | 156/617 SP |
| 4,469,552 | 9/1984 | Thornhill | 156/DIG. 88 |
| 4,609,425 | 9/1986 | Mateika et al. | 422/249 |

FOREIGN PATENT DOCUMENTS 3612 2/1972 Japan .

OTHER PUBLICATIONS

Mateika et al., Journal of Crystal Growth, 65 (1983) 237–242.
Whiffin et al., Journal of Crystal Growth, 10 (1971) 91–96.

*Primary Examiner*—John Doll
*Assistant Examiner*—R. Bruce Breneman
*Attorney, Agent, or Firm*—Wenderoth, Lind & Ponack

[57] ABSTRACT

In a process for pulling a crystal such as Si, Ge, GaAs, InP, GaP, InAs, AlAs, CdTe, CdSe, ZnTe, HgTe, MnTe, $Gd_3Ga_5O_{12}$, $Bi_{12}SiO_{20}$ and $LiNbO_3$ from a raw material melt within a baffle plate whose bore diameter is gradually increased upward and which is arranged in such a manner that the melt inside and outside the baffle plate is in communication with each other through the small opening part at the end thereof, the baffle plate is moved relatively to the surface of the melt so as to increase the diameter of the melt surface inside the baffle plate with the increase of the diameter of the pulled crystal at the solid-liquid interface.

6 Claims, 2 Drawing Sheets

(A)

(B)

(C)

PROCESS OF PULLING A CRYSTAL

This application is a continuation of now abandoned application Ser. No. 900,008, filed Aug. 20, 1986, now abandoned.

BACKGROUND OF THE INVENTION

1. Field of the Invention

This invention relates to a process for pulling a single crystal and more particularly. it is concerned with a process for pulling up a single crystal of GaAs, InP, GaP, InAs, AlAs, CdSe, CdTe, ZnTe, MnTe or HgTe or mixed crystals thereof, and an apparatus for carrying out this process.

2. Description of the Prior Art

Control of the temperature distribution in a raw material melt and the temperature fluctuation with the passage of time has hitherto been carried out by inserting a baffle plate in the raw material melt to suppress a convection in the melt.

The prior art relative to the present invention is exemplified as follows:

(1) "J, Crystal Growth" 10, 91–96 (1971), P.A.C. Whiffin and J. C. Brice
(2) Japanese Patent Application OPI (Kokai) No. 3612/1972
(3) Japanese Patent Application OPI (Kokai) No. 64482/1976
(4) Japanese Patent Application OPI (Kokai) No. 188500/1982
(5) Japanese Patent Application OPI (Kokai) No. 15097/1983
(6) "J. Crystal Growth", 65, 237–242 (1983), D. Mateika, R. Laurien and M. Liehr The above described References 1 and 2 show that the temperature fluctuation is suppressed and the radial temperature distribution is flattened in a raw material melt to grow a strain-free homogeneous crystal by providing a baffle plate substantially vertically to the pulling direction of the crystal in a range of ¼ to ¾ of the depth of the raw material melt from the bottom of a crucible (FIG. 7).

Reference 3 describes that a baffle plate having an opening at the central part is floated on a raw material melt and a single crystal is pulled through the opening to control the shape of the single crystal, the baffle plate being made of boron nitride (BN), quartz ($SiO_2$), graphite (C), silicon nitride (SiN) or silicon carbide (SiC).

Reference 4 discloses the use of a sintered body of $Si_3N_4$-$Y_2O_3$ type or lanthanide element oxide-$Al_2O_3$ type, excellent in corrosion resistance at high temperatures and mechanical strengths, as a material of a baffle plate.

Reference 5 describes an apparatus in which a baffle plate is provided on a raw material melt and supported at a suitable position by a guide pin.

Reference 6 discloses that a single crystal of $Nd_3Ga_3O_{12}$ is grown by devising the position of an opening provided in a baffle plate and thereby controlling the temperature distribution in the radius direction to a desirable distribution, as shown in FIG. 8.

In the case of flattening the radial temperature distribution of a melt as shown in References 1 and 2, the so-called seeding and growth of the shoulder or cone part are so unstable that the diameter of a pulled crystal often fluctuates.

In the case of References 3, 4 and 5, these inventions are made to suppress the diameter fluctuation for the purpose of making a crystal with a constant trunk diameter and pulling of the straight trunk part can stably be carried out but prevention of the unstable operation from seeding to growth of a shoulder or cone part, as proposed by References 1 and 2, is impossible. Thus, these inventions have a disadvantage that the crystal growth of a cone part is so unstable that an abnormal growth takes place, resulting in frequent formation of twin crysatals or polycrystalline substances, and a high quality single crystal is hardly obtained.

In the case of crystals which tend to give a convex solid-liquid interface during growth, as described in Reference 6, on the other hand, pulling of the crystal is made possible by using a baffle plate and holding the temperature lower at the center of a crucible than at the circumference thereof, but as the temperature of the melt is gradually lowered because of increase of the diameter of the pulled crystal, there is a remarkable tendency for the solid-liquid interface to become concave so that the resulting crystal is not homogeneous.

In the prior art as described above, a baffle plate has always been used in such a manner that the diameter of the surface of a raw material melt in the baffle plate is held constant, and change thereof has not been carried out with the increase of the diameter of a pulled crystal. Therefore, the effect of the baffle plate cannot sufficiently be exhibited throughout the process of pulling.

In order to solve the above described problem, it is required to control best the temperature distribution of a melt in the radius direction with the increase of the diameter of a crystal during pulling.

SUMMARY OF THE INVENTION

It is an object of the present invention to provide a process for pulling a single crystal, whereby the above described disadvantages of the prior art process of pulling a crystal using a baffle plate, can be overcome.

It is another object of the present invention to provide a process for pulling a homogeneous crystal with reduced crystal defects of twins, grain boundaries and dislocations by controlling the radial temperature distribution of a melt with the increase of the diameter of a pulled crystal at the solid-liquid interface and thereby stabilizing the growth and flattening the solid-liquid interface throughout the process of pulling.

These objects can be attained by a process for pulling a crystal from a raw material melt in a baffle plate whose bore diameter is gradually increased upward and which is arranged in such a manner that the melt inside and outside the baffle plate is in communication with each other through the small opening part at the end thereof, characterized in that the baffle plate is moved relatively to the surface of the melt so as to increase the diameter of the melt surface inside the baffle plate with the increase of the diameter of the pulled crystal at the solid-liquid interface.

BRIEF DESCRIPTION OF THE DRAWINGS

The accompanying drawings illustrate the principle and merits of the present invention in more detail.

DETAILED DESCRIPTION OF THE INVENTION

Figure 1:
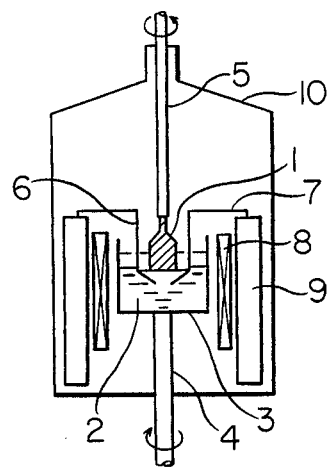
FIG. 1 is a cross-sectional view of an apparatus for pulling a crystal, as one embodiment of the present invention.

The inventors have endeavored to solve the problems in the processes and apparatus for pulling crystals using baffle plates according to the prior art and consequently, have found that the use of a baffle plate whose bore diameter is increased upward is effective for solving the problems. Accordingly, the present invention provides a process for pulling a crystal from a raw material melt within a baffle plate whose bore diameter is gradually increased upward and which is arranged in such a manner that the melt inside and outside the baffle plate is in communication with each other through the small opening part at the end thereof, characterized in that the baffle plate is moved relatively to the surface of the melt so as to increase the diameter of the melt surface inside the baffle with the increase of the diameter of the pulled crystal at the solid-liquid interface.

In this process, the baffle plate whose bore diameter is gradually increased upward can have a suitable form such that the bore diameter is changed constantly, e.g. a funnel of inverse truncated cone type, or such that the bore diameter is changed variably, e.g. a tapering funnel. In addition, the baffle plate can be provided, at the upper end thereof, with a straight trunk part. Generally, the baffle plate can be made of a material which has a chemical stability to raw material melts and a heat resistance, for example, carbon, sintered boron nitride, pyroltic boron nitride, aluminum nitride, quartz, silicon carbide, silicon nitride and any other material which is inert to the melt.

In particular, the present invention is suitable for the growth of Group IV element semiconductors such as Si, Ge and the like, Group III-V compound crystals such as GaAs, InP, GaP, InAs, AlAs and the like, and mixed crystals thereof, Group II-VI compound crystals such as CdTe, CdSe, ZnTe, HgTe and the like, and mixed crystals thereof, MnTe crystals and oxide crystals such as $Gd_3Ga_5O_{12}$, $Bi_{12}SiO_{20}$, $LiNbO_3$ and the like.

A preferred embodiment of an apparatus suitable for carrying out the process of the present invention will be illustrated: In an apparatus for pulling up a crystal comprising a crucible for holding a raw material melt, a pull shaft for pulling the crystal from the melt, a baffle plate for partitioning a crystal pulling zone at the central part of the melt, a heating means for imparting a predetermined temperature distribution to the melt and optionally, a means for moving the crucible up and down, as the baffle plate use is made of a baffle plate whose bore diameter is gradually increased upward, the baffle plate is arranged in such a manner that the melt inside and outside the baffle plate is in communication with each other through the small opening part at the end thereof, and the baffle plate is moved relatively to the surface of the melt so as to increase the diameter of the melt surface inside the baffle plate with the increase of the diameter of the pulled crystal at the solid-liquid interface.

FIG. 1 is a cross-sectional view of an apparatus for pulling a crystal, suitable for carrying out the process of the present invention.

A crucible 3 holding a raw material melt 2 is supported at the center of a chamber 10 by a crucible supporting shaft 4 and a heater 8 and heat insulating material 9 are provided around the crucible 3 to heat the raw material. On the other hand, a baffle plate 6 is immersed in the raw material melt 2 and from the center thereof is pulled a crystal 1 by a pulling shaft 5. The pulling shaft 5 and crucible supporting shaft 4 have means for moving vertically while revolving (not shown). The baffle plate 6 is fixed to the heat insulating material by a baffle plate supporting means 7 and optionally can be provided with a vertically moving means.

Figure 2:
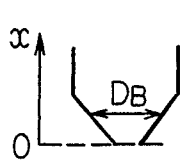
FIG. 2 is a schematic view of a baffle plate used in the present invention.
Figure 3:
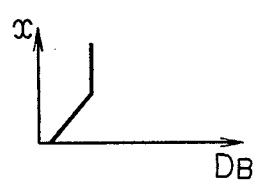
FIG. 3 is a graph showing a change of the diameter of a melt surface inside a baffle plate.
Figure 4:
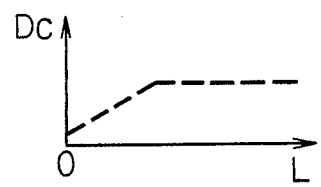
FIG. 4 is a graph showing the relationship between the length of a crystal and the diameter of a pulled crystal.

FIG. 2 is a schematic view of one example of a baffle plate used in the present invention, comprising an upper straight trunk part and a lower funnel part. If x represents a position in the height direction when the lower end of the funnel part is at point zero, the diameter of a melt surface inside the baffle plate, $D_B$, can be as shown in FIG. 3. The pulled crystal is grown in such a manner that the diameter $D_C$ of the crystal at the solid-liquid interface is gradually increased from the size of an original seed crystal to a desired diameter as the crystal is pulled, as shown in FIG. 4, after which it is grown in the form of a circular cylinder.

Figure 5:
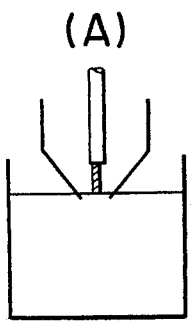
FIG. 5 (A), (B) and (C) are schematic views of positions of a baffle plate in three stages of pulling a crystal.
Figure 5:
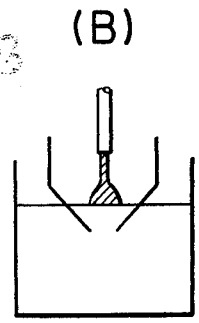
Figure 5:
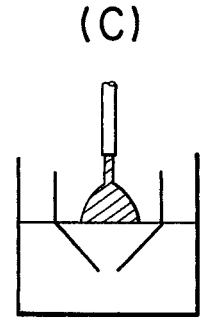

FIG. 5 are schematic views showing the positional relationship of a baffle plate with the increase of the diameter of a pulled crystal, in which (A) shows a stage of seeding, (B) shows a stage of forming a shoulder or cone part and (C) shows a stage of forming a straight trunk part of the pulled crystal. The baffle plate is moved downward relative to the surface of the melt as the crystal is pulled. Preferably, the movement of the baffle plate is carried out so that the inner diameter $D_B$ of the baffle plate be proportional to the diameter $D_C$ of the pulled crystal during the process of the movement. Of course, instead of moving the baffle plate, the crucible can be moved. Change of the diameter of the baffle plate is preferably adjusted to formation of a shoulder or cone part of a crystal.

Figure 6:
FIG. 6 is a schematic view of a temperture distribution of a melt in a crucible when using no baffle plate.
Figure 7:
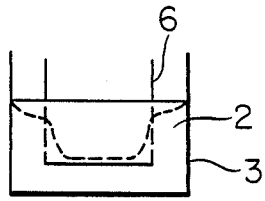
FIG. 7 is a schematic view of a temperature distribution of a melt in the case of using a cylindrical baffle plate.
Figure 8:
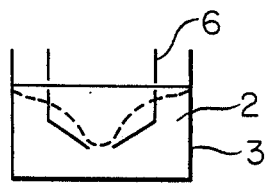
FIG. 8 is a schematic view of a temperature distribution of a melt in the case of using a baffle plate having an upper cylindrical form and a lower funnel form.

FIG. 6 shows, by broken line, the temperature distribution of a melt 2 in a crucible 3 in the case of not using a baffle plate 6, while FIG. 7 and FIG. 8 show examples in the case of using baffle plates 6. The temperature distribution of the melt depends on the diameter of the baffle plate.

The type of the distribution is also varied with the position or number of holes made in a baffle plate, which can be controlled depending on the object. In summary, the temperature distribution of the melt in the radius direction can be controlled by changing the inner diameter of the baffle plate during pulling.

Figure 9:
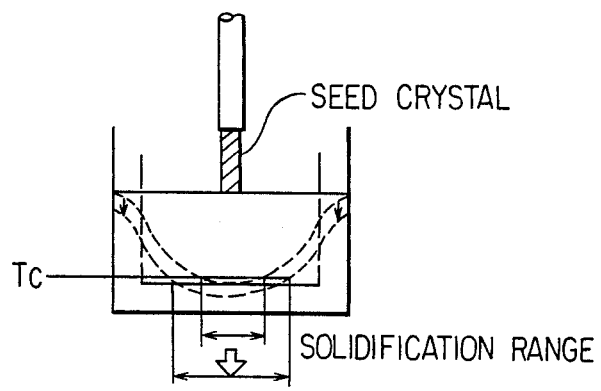
FIG. 9 is a schematic view showing the relationship between a seeding of a crystal and temperature distribution of a melt.

Depending upon the shape of the radial temperature distribution, a rapid change of the crystal diameter and concave-shaping of the solid-liquid interface take place as described above. The reason therefor will now be illustrated: A pulling state immediately after seeding is taken into consideration, during which if a baffle plate having an inner diameter $D_B$ much larger than the diameter $D_C$ of the seed crystal is used, the radial temperature distribution is considerably flat within the inner diameter $D_B$ of the baffle plate as shown in FIG. 9. If the crystal solidifying temperature at this time is represented by $T_C$, the temperature in the melt is lower than the crystal solidifying temperature $T_C$ over the larger diameter by a slight change of temperature. That is, the crystal diameter becomes suddenly larger than the size of the seed crystal. On the contrary, if higher than the solidifying temperature $T_C$, the crystal diameter becomes suddenly smaller. When using a baffle plate with an inner diameter $D_B$ somewhat larger than the size $D_C$ of the seed crystal, the above described range of the flat part of the radial temperature distribution becomes smaller and the fluctuation range of the crystal diameter with the fluctuation of the temperature is decreased. On the other hand, in the case of Reference 6 for example, the radial temperature distribution is of the so-called steep V-type within a baffle plate and increase of the crystal diameter is difficult. Thus, if the temperature of the melt is lowered, a range of lower than the solidification temperature is enlarged and the crystal diameter is increased, but the temperature at the central part is lowered so that the solid-liquid interface tends to be concave at the central part. In this case, therefore, it is necessary to increase gradually the inner diameter $D_B$ of a baffle plate and to thus increase the crystal diameter.

The advantatges or merits according to the present invention are summarized below:

(1) Control of the radial temperature distribution of a melt by a baffle plate can be varied during pulling a crystal and depending upon the diameter of the crystal, an optimum distribution can be attained. Consequently, it is possible to accomplish stabilization of the crystal growth as well as flattening of the solid-liquid interface throughout the process of pulling, thus resulting in uniform growth of a single crystal.

(2) The shape of a baffle plate is so simple that a complicated working is not required.

(3) The process of the present invention is available for any growth of a single crystal using the pulling method.

EXAMPLE 1.6 kg of GaAs crystal was charged in a quartz crucible of 101.6 mm (4 inch) in diameter. A baffle plate was made of boron nitride with a straight trunk length of 40 mm, inner diameter of 60 mm, tapered part height of 25 mm and lower end opening diameter of 10 mm. A seed crystal of 4 mm square was used. A pulling furnace was filled with nitrogen gas under a pressure of 15 atm and pulling was carried out at a pulling speed of 10 mm/H, revolution number of a pulling shaft of 5 rpm and revolution number of a crucible supporting shaft of 12 rpm. This operation was started while the baffle plate was immersed in the melt by 5 mm at seeding, and thereafter, the immersion was gradually continued until the length and diameter of the pulled crystal were respectively 20 mm and 50 mm. When the crystal diameter reached the straight trunk part of 50 mm, the baffle plate was stopped or moved so as to hold the diameter of the melt surface in the baffle plate in 60 mm and the pulling was continued. The relative movement of the baffle plate to the crucible was carried out by fixing the baffle plate and gradually pushing up the crucible. The thus pulled crystal had a diameter of 50 mm and a weight of about 1.5 kg and during the pulling process, there were found no sudden fluctuation of the diameter, nor growth of dendrite.

Examination by X-ray topography showed that the solid-liquid interface of the crystal was substantially flat and there was no irregular striation due to temperature fluctuation of the melt.

What is claimed is:

1. In a Czochralski process for pulling a crystal from a raw material melt comprising providing a baffle plate whose bore diameter is gradually increased upward and which is arranged in such a manner that the melt inside and outside the baffle plate is in communication with each other through a small opening part at the bottom end thereof, the improvement of which comprises moving the baffle plate relatively to the surface of the melt in such a manner that an annular space is maintained between the baffle plate and the crystal, and so as to increase the diameter of the melt surface inside the baffle plate with an increase of the diameter of the pulled crystal at the solid-liquid interface between the crystal and the melt surface.

2. The process of claim 1, wherein the baffle plate is in the form of a tapering funnel whose cone angle is changed.

3. The process of claim 1, wherein the baffle plate is in the form of a funnel of inverse truncated cone type.

4. The process of claim 1, wherein the baffle plate is provided, at the upper end thereof, with a straight trunk part.

5. The process of claim 1, wherein the crystal is selected from the group consisting of Si, Ge, GaAs, InP, GaP, InAs, AlAs, CdTe, CdSe, ZnTe, HgTe, MnTe, $Gd_3Ga_5O_{12}$, $Bi_{12}SiO_{20}$ and $LiNbO_3$, and mixed crystals thereof.

6. The process of claim 1, wherein the baffle plate is made of a material selected from the group consisting of carbon, sintered boron nitride, pyrolytic boron nitride, aluminum nitride, quartz, silicon carbide, silicon nitride and any other material which is inert to the melt.

* * * * *